(12) United States Patent
Awsiuk et al.

(10) Patent No.: US 10,814,531 B2
(45) Date of Patent: Oct. 27, 2020

(54) DEVICE AND A METHOD FOR PREPARATION OF POLYMER FILMS HAVING A PREDEFINED SPATIAL STRUCTURE

(71) Applicant: UNIWERSYTET JAGIELLONSKI, Cracow (PL)

(72) Inventors: Kamil Awsiuk, Cracow (PL); Jakub Rysz, Czernichow (PL); Mateusz Marzec, Cracow (PL); Andrzej Budkowski, Cracow (PL)

(73) Assignee: UNIWERSYTET JAGIELLONSKI, Cracow (PL)

( * ) Notice: Subject to any disclaimer, the term of this patent is extended or adjusted under 35 U.S.C. 154(b) by 0 days.

(21) Appl. No.: 16/338,481

(22) PCT Filed: Sep. 25, 2017

(86) PCT No.: PCT/PL2017/050048
§ 371 (c)(1),
(2) Date: Mar. 31, 2019

(87) PCT Pub. No.: WO2018/063017
PCT Pub. Date: Apr. 5, 2018

(65) Prior Publication Data
US 2019/0291310 A1 Sep. 26, 2019

(30) Foreign Application Priority Data

Oct. 1, 2016 (PL) .......................................... 418951

(51) Int. Cl.
*B29C 41/50* (2006.01)
*B05C 11/02* (2006.01)
(Continued)

(52) U.S. Cl.
CPC .............. *B29C 41/50* (2013.01); *B05C 11/02* (2013.01); *B29C 41/12* (2013.01); *B29D 7/01* (2013.01);
(Continued)

(58) Field of Classification Search
None
See application file for complete search history.

(56) References Cited

U.S. PATENT DOCUMENTS 5,325,120 A * 6/1994 Kuehnle ............... B41F 21/005
347/113
5,343,234 A * 8/1994 Kuehnle ................... B41F 7/18
347/128
(Continued)

Primary Examiner — Jethro M. Pence
(74) Attorney, Agent, or Firm — Mark M. Friedman

(57) ABSTRACT

A device for producing polymer films having a predefined spatial structure. The device includes: a linear stage, a platform for a substrate, a cylinder for spreading a polymer solution layer over the substrate to deposit a polymer film onto the substrate, a cylinder height adjustment system, a control system for adjusting a height and tilt of the cylinder in relation to the substrate, a controllable voltage source, one or more metallic electrodes fixed onto the cylinder. The substrate onto which the polymer film is deposited is conductive for electric current. Electric voltage from the controllable voltage source is applied between the metallic electrode and the substrate during deposition of the polymer film onto the substrate.

10 Claims, 6 Drawing Sheets

(51) Int. Cl.
*B29C 41/12* (2006.01)
*B29D 7/01* (2006.01)
*C08J 5/18* (2006.01)
*H01L 51/00* (2006.01)
*H01L 51/05* (2006.01)

(52) U.S. Cl.
CPC ............ *C08J 5/18* (2013.01); *H01L 51/0003* (2013.01); *H01L 51/0508* (2013.01)

(56) References Cited

U.S. PATENT DOCUMENTS

| | | | |
|---|---|---|---|
| 6,621,191 B1* | 9/2003 | Nomura | H02N 1/004 251/129.01 |
| 2003/0057595 A1* | 3/2003 | Tsujimoto | C08J 5/18 264/217 |
| 2005/0238937 A1* | 10/2005 | Oren | C08J 5/22 521/27 |
| 2010/0014888 A1* | 1/2010 | Ikeda | G03G 5/08235 399/159 |
| 2012/0268708 A1* | 10/2012 | Chida | G02F 1/13392 349/153 |
| 2014/0242508 A1* | 8/2014 | Nakamura | G03G 5/08278 430/56 |
| 2016/0089842 A1* | 3/2016 | Cakmak | B29C 71/0081 264/437 |
| 2016/0096185 A1* | 4/2016 | Nobuo | B05B 5/057 438/46 |
| 2016/0200055 A1* | 7/2016 | Moon | B29C 71/0081 425/162 |

* cited by examiner

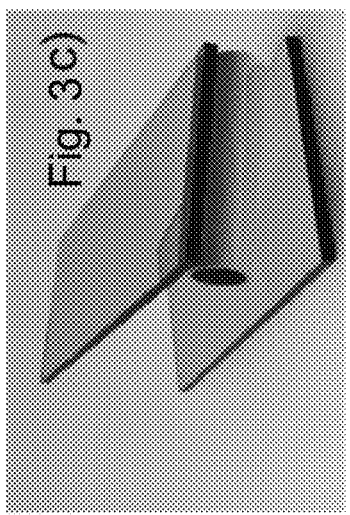
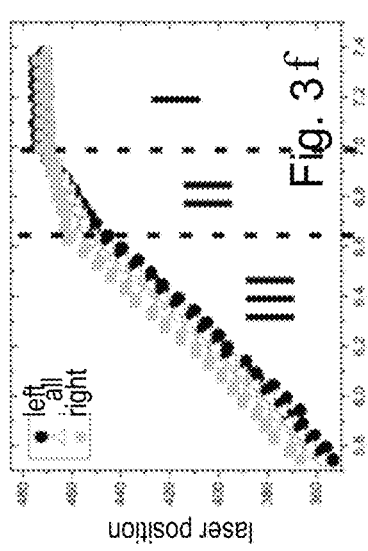
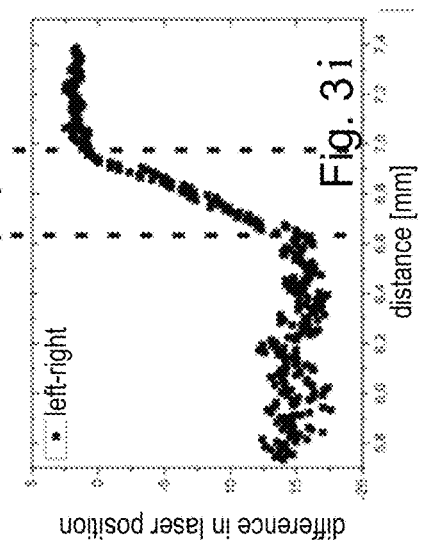
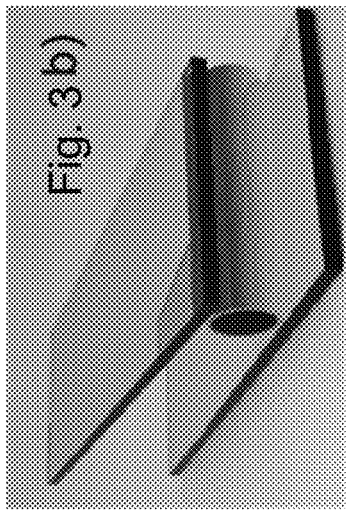
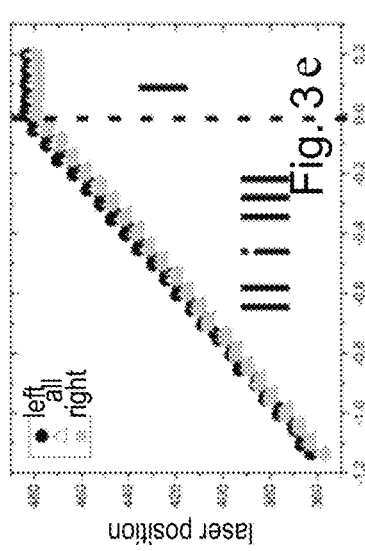
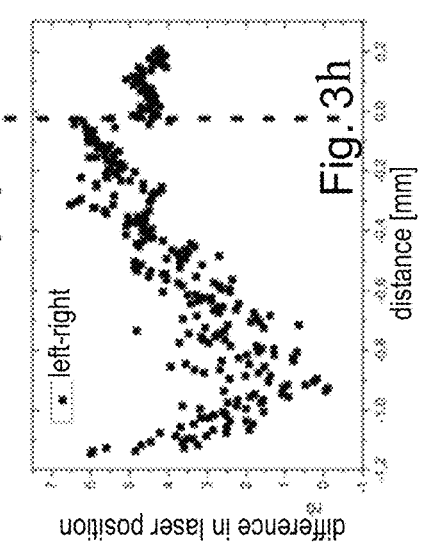
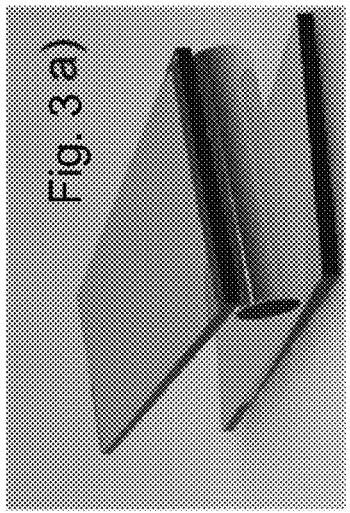
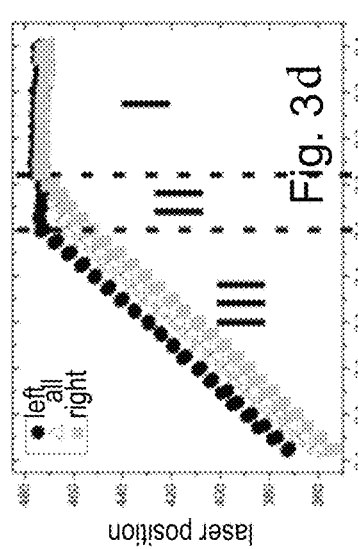
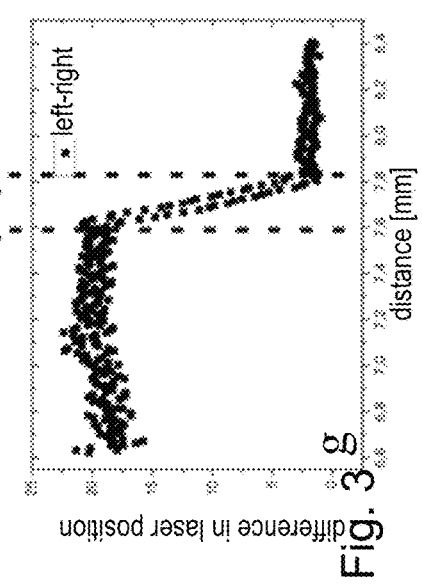

Fig. 5a RP3HT+PEG-PCL (50:50)
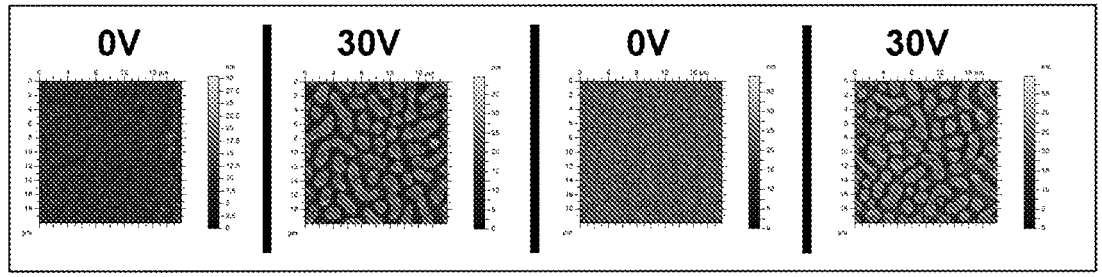
Fig. 5b RP3HT+PEG-PCL (55:45)
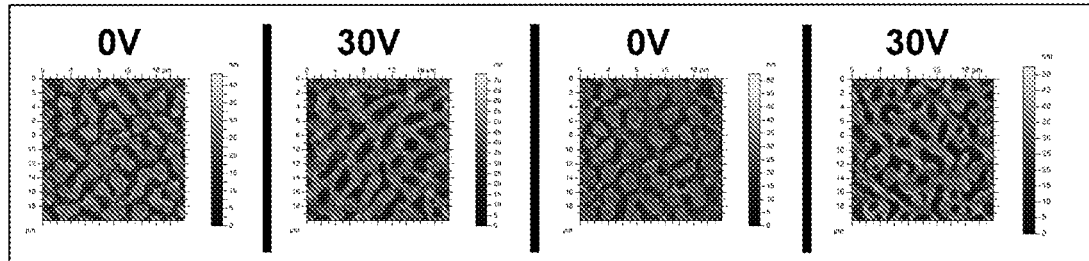
Fig. 5c RP3HT+PEG-PCL (60:40)
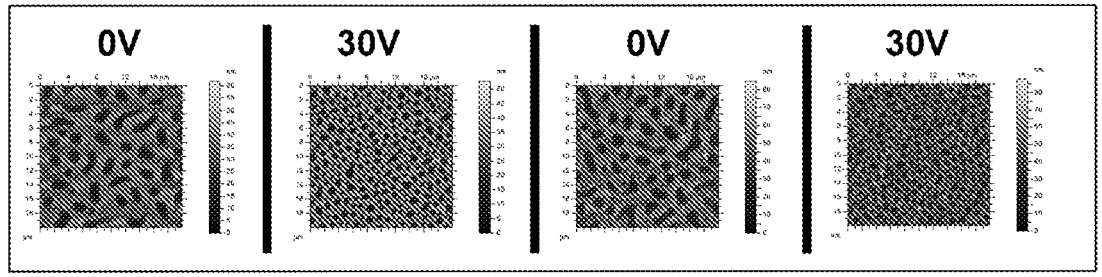
Fig. 5d RP3HT+PMMA (50:50)
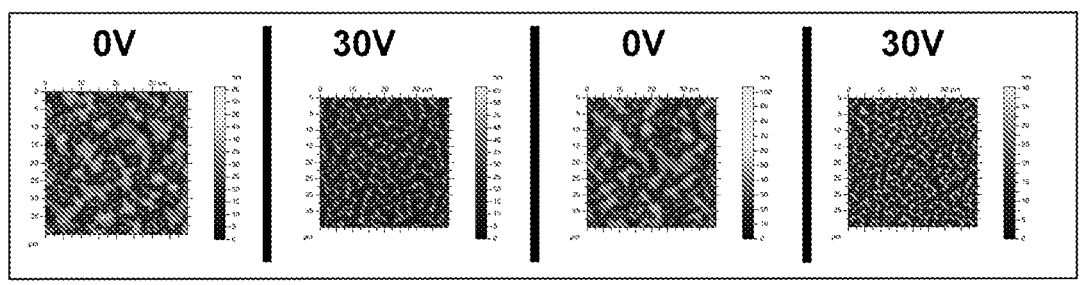
Fig. 5e PQT12+PEG-PCL (50:50)
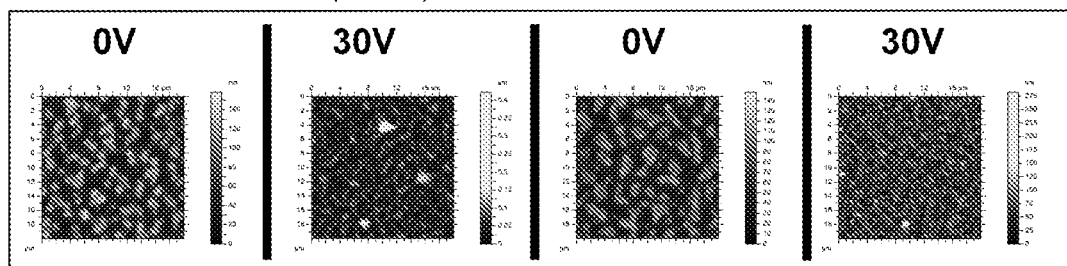

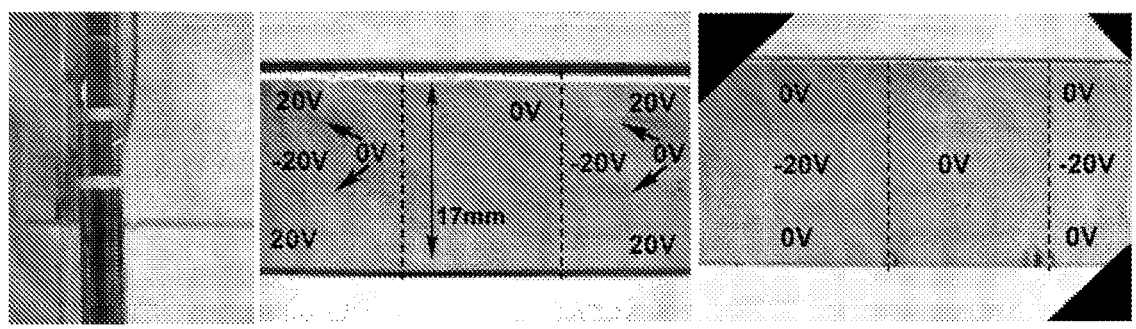
Fig. 6
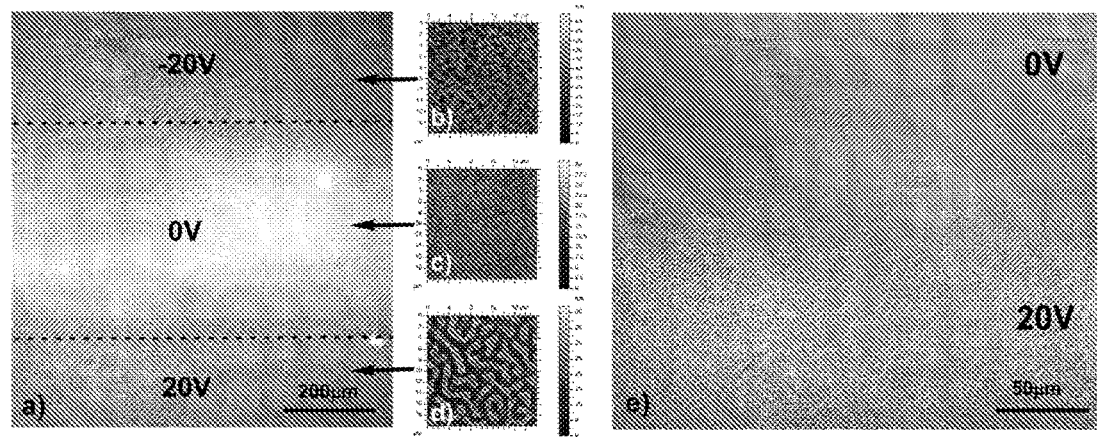
Fig. 7
Fig. 8

DEVICE AND A METHOD FOR PREPARATION OF POLYMER FILMS HAVING A PREDEFINED SPATIAL STRUCTURE

The invention relates to a device and a method for preparation of polymer films having a predefined spatial structure, using an electric field. The structure of the polymer films strongly affects their physico-chemical properties, e.g. electro-optical properties in case of single component films of conjugated polymer, or photonic properties, electro-optical properties and wettability, in case of polymer composites. Therefore, the device and the method according to the present invention find application in a production of large-area devices of "plastic" electronics and solar cells, antireflective surfaces, super-hydrophobic coatings, protein microarrays, or substrates for cell cultures.

The most frequently used techniques for formation of thin polymer films include deposition from solution by the spin-coating (spin-casting) method. In this method, a polymer solution is applied onto a substrate while spinning or before setting it in a fast rotary motion (of the order of several thousand revolutions per minute). The layer of the polymer-solvent mixture is spread onto the substrate under the influence of the centrifugal force; also, a rapid evaporation of the solvent occurs during this process.

For the binary polymer-solvent system, the thickness of the layer being obtained may be adjusted by changing the polymer concentration in the solution, as well as the rate of rotation. The spin-coating method allows for obtaining films with uniform thickness on the whole area of the substrate. Using additional technological steps before, during or after the film deposition process, films with a desired structure may be obtained. The disadvantage of this method is a limited area of the substrate, onto which the polymer film is deposited.

Another method of formation of thin polymer films is the so-called horizontal dipping (h-dipping) method. The h-dipping method was disclosed, for example, in a scientific publication by J. Rysz et al., "Pattern replication in blends of semiconducting and insulating polymers casted by horizontal dipping," J. Polym. Sci Part B Polym. Phys., 51 (2013), pp. 1419-1426. Although spin-coating is used in production lines, h-dipping is more compatible with the roll-to-roll technology, which, according to the experts, will become commonly used in the production of large-area devices of "plastic" electronics on flexible films. In this technique, the polymer solution is dosed between a substrate and a cylinder with a diameter of several millimetres, moving above the substrate at a constant height of the order of several dozen micrometers. Behind the cylinder, a thin film of the solution forms on the substrate. By changing the speed of the cylinder and/or its height above the substrate surface, it is possible to change the thickness of the polymer film locally, which is usually connected with a change in its structure.

It is also noteworthy here that in case of molecular conductors, the electro-optical properties of films of the conjugated polymers strongly depend on their ordering. Groups of polymers most frequently used in plastic electronics include polythiophenes containing a rigid main chain and alkyl side groups. These polymers exhibit a propensity to crystallize in the film, and the structure of electron levels and the charge carriers mobility depend strongly on interactions between the chains in the crystallite. As a rule, an increase in the ordering leads to an increase in the range of the coupling between the orbitals, resulting in an increase in the conductivity or a shift in the spectra of light absorption and emission towards the infrared. On this account, the orientation of the crystallites in the film plays an important role in controlling the electro-optical properties of these materials, and therefore their application in plastic electronics. In case of a mixture of several polymers, during the solvent evaporation, a phase separation of domains rich in different polymers and self-organization of these domains into "frozen" structure after the solvent evaporation may occur in both methods of deposition of the films. In this way, composite films with domains forming complementary structural elements of electronic devices (e.g. semiconductor and dielectric lamellae of the gate terminal in FET), photovoltaic devices (e.g. donor and acceptor materials forming heterojunctions), photonic devices (e.g. areas with various refractive indices in anti-reflective coatings) and biotechnological devices (e.g. surface patterns of domains grouping proteins in microarrays) may be simply and cheaply manufactured from solutions of functional polymers with various properties (as reported e.g. in A. Budkowski et al., "Polymer blends spin-cast into films with complementary elements for electronics and biotechnology," J. Appl. Polym. Sci., 125 (2012), pp. 4275-4284).

In case of thin films, the phenomenon of self-organization of polymer mixtures is affected significantly by the type of the interaction with the substrate. Due to this interaction, domain structures forming as a result of self-organization, are controlled by the properties of the substrate surface. A modification of surface properties according to a predefined template leads to formation of patterns of areas with various structures in the film being prepared. In a several-step technological process, at first, the substrate is modified by e.g. lithographic techniques (soft lithography, photolithography or electron-beam lithography), and then, a polymer film is applied onto the substrate prepared this way. Currently, the most inexpensive and effective methods are soft lithography methods, utilising an elastic stamp to modify a defined area and transfer a pattern onto the surface. They result in ordered patterns of polymer areas with various structures and functionalities (e.g. conducting and insulating), which has been demonstrated for films formed by both the spin-coating (A. Budkowski, 2012), and the h-dipping (J. Rysz, 2013) methods. A combination of soft lithography and deposition of films of polymer mixtures from a solution enables to control areas with a structure changing according to even very complicated patterns, e.g. layers used as matrices of several dozens of transistors (see, for example, A. Salleo and A. C. Arias, "Solution based self-organization of an array of polymeric thin-film transistors, Adv. Mater. 19 (2007), p. 3540). Unfortunately, application of soft lithography methods is another step requiring additional amounts of labour (e.g. for preparation of the stamp acc. to a previously prepared template), and it increases the duration of whole process and its costs. On this account, new simpler methods for preparation polymer films having a predefined spatial structure, e.g. already during the polymer film deposition, are sought for.

In the state of art, also electrical field, applied perpendicularly to the film, was used for modification of the structure of a polymer film (e.g. E. Schaeffer et al., "Electrically induced structure formation and pattern transfer," Nature. 403 (2000), p. 874-7). In the described experiment, pre-prepared films of one polymer were placed between a capacitor plates, and then heated to a temperature above their glass transition temperature, or exposed to solvent vapours. A strong electrical field created forces which were able to overcome the surface tension and cause formation of an instability in the liquid polymer thin film. By using electrodes with various shapes, preparation of the predefined polymer structures was possible. The above method was used also for preparation of two-polymer patterns (e.g. Z. Lin et al., "Structure formation at the interface of liquid/liquid bilayer in electric field", Macromolecules 35 (2002) 3971). However, it required preparation of two polymer films in individual steps, deposited one on the other.

Electrical field was used also to modify the domain structure of polymer mixture films formed by evaporation of the solvent (e.g. T. Kikuchi et al., "Electrohydrodynamic effect on phase separation morphology in polymer blend films", Langmuir 20 (2004), s. 1234), including those prepared by spin-coating of composite films of a conducting and insulating polymers (S. Wang et al., "The effect of the electric-field on the phase separation of semiconductor-insulator composite film," Chem. Commun. (Camb), 51 (2015), pp. 765-7). Modification of the film morphology was obtained using an electrical field affecting the phase separation process (e.g. G. Venugopal, S. Krause, "Development of phase morphologies of poly(methyl methacrylate)-polystyrene-toluene mixtures in electric fields", Macromolecules 25 (1992) 4626). In all these works, the electrodes were formed on (or in) the substrate. As a consequence, the electrical field was oriented parallel to the substrate, and the polymer film was subjected to the modification only in a small region between the electrodes.

A technical problem arising in the case of present invention consists in proposing such a method and device for preparation of polymer films, which would allow for preparing the polymer films having a predefined spatial structure already during the film deposition, without additional technological steps. Moreover, it is advisable that this method and this device allow for rapid forming uniform large-area films with a predefined thickness, particularly in a way compatible with the roll-to-roll technology, and ensure economic advantages. Surprisingly, the mentioned technical problems were solved by the present invention.

The first subject of the invention is a device for production of polymer films having a predefined spatial structure characterised in that it comprises a linear stage, a cylinder spreading a polymer solution, a platform for a substrate, a cylinder height adjustment system, a control system for the cylinder height and tilt in relation to the substrate and a controllable voltage source, wherein at least one metallic electrode is fixed onto the cylinder, the substrate onto which the polymer film is deposited is conductive for electric current; and the electric voltage from the controllable voltage source is applied between the at least one metallic electrode and the substrate during deposition of the polymer solution onto the substrate.

In a preferred embodiment of the invention, the platform for the substrate is placed on the linear stage ensuring a linear movement of the substrate in relation to the stationary cylinder.

In another preferred embodiment of the invention, the cylinder height adjustment system is constituted by a micrometer screw.

In a further preferred embodiment of the invention, the cylinder height control system comprises a laser, a detector and the cylinder fixed to a glass, the elements being arranged so that the laser emits a linear light beam directed onto the glass connected to the cylinder, and the beam reflected from the glass hits the detector.

Preferably, the platform for the substrate has an inclination adjustment system for at least one inclination plane, preferably for three planes.

Equally preferably, the cylinder is fixed to a cylinder platform, having an inclination adjustment system for at least two inclination planes, preferably for three planes.

Even more preferably, the device is placed on a device platform carried by three levelling legs.

In a preferred embodiment of the invention, the cylinder is made of an insulator material, preferably of glass.

In another preferred embodiment of the invention, at least one electrode corresponding to a desired pattern being formed in the polymer layers is mounted on the cylinder and preferably, the electrode preferably being made of gold.

In a further preferred embodiment of the invention, a controllable voltage source generates a constant voltage or time-alternating, square-wave, sinusoidal, triangle-wave voltage, having a predefined frequency and amplitude.

The second subject of the invention is a method for preparation of polymer films having a predefined spatial structure, the method comprising the following steps:
 a) preparing a polymer solution for the polymer film,
 b) providing a substrate for the polymer film,
 c) dosing the polymer solution between the substrate and a cylinder spreading the polymer solution,
 d) spreading the polymer solution by providing a linear movement of the substrate and/or the cylinder,
wherein during spreading of the polymer solution, a movement speed, an acceleration, the cylinder height and inclination over the substrate are controlled, the method being characterised in that the cylinder has at least one metallic electrode evaporated thereon, and the substrate conducts electric current, and that during the spreading of the polymer solution electric voltage is applied between the at least one metallic electrode and the substrate.

Preferably, the solution for the polymer layer is constituted by a polymer mixture.

In a preferred embodiment of the invention, the cylinder has two or more metallic electrodes evaporated thereon, and during spreading of the polymer solution an electric voltage is applied between the metallic electrodes on the cylinder and substrate.

In another preferred embodiment of the invention, the electric voltage applied during spreading of the polymer solution is a constant electric voltage or a square-wave, sinusoidal, triangle-wave alternating voltage with a value within the range of −30 V to 30 V with a predefined frequency, preferably of 1 Hz.

In a further preferred embodiment of the invention, the solution of polymers in chlorobenzene with a concentration of 15 mg/ml for the polymer films is constituted by a mixture of RP3HT and PEG-PCL in a weight ratio from 40:60 to 60:40, a mixture of RP3HT and PMMA in a 50:50 weight ratio or a mixture of PQT12 and PEG-PCL in a 50:50 weight ratio.

BRIEF DESCRIPTION OF THE DRAWINGS

Some embodiments of the present invention are herein described, by way of example only, with reference to the accompanying drawings. With specific reference to the drawings in detail, it is stressed that the particulars shown are by way of example and for purposes of illustrative discussion of embodiments of the invention. In this regard, the description taken with the drawings makes apparent of those skilled in the art how embodiments of the invention may be practiced.

Attention is now directed to the drawings, where like reference numerals or characters indicate corresponding or like components. In the drawings:

FIGS. 3a-3c are schematic representation of various positions of the cylinder in relation to the substrate;

FIGS. 3d-3f are plots of the laser spot location vs. the height of the cylinder holder above the sample's surface;

FIGS. 3g-3i are plots of the difference of the laser spot location vs. the height of the cylinder holder above the sample's surface;

FIG. 5a-5e are AFM images disclosing the impact of the electrical field on the phase separation in various polymer mixtures;

FIG. 6a is a photograph of a cylinder with electrodes applied;

FIGS. 6b-6c are photographs of polymer films prepared for use in various configurations of voltages applied to the electrodes formed on the cylinder of FIG. 6a;

FIG. 7a-7d are fluorescence microscope photograph and AFM topographic images illustrating a difference in the structure of the polymer film formed by the method according to the present invention depending on the applied voltage;

FIG. 7e is a fluorescence microscope photograph illustrating a magnification of the boundary between various structures of the polymer film;

FIG. 8a is a photograph of another polymer film formed by the method according to the present invention using a variable field; and, FIG. 8b is a fluorescence microscope photograph of the polymer film of FIG. 8a.

The presented method for formation of patterns in the polymer films envisages utilisation of the electrical field oriented perpendicularly to the surface of the film in order to form polymer films with a predefined structure. The main advantage of the presented solution consists in the possibility to create a polymer film with a precisely defined structure already at the stage of the film's formation, thus reducing the number of additional technological steps. Another advantage of the method according to the present invention consists in the possibility to create large-area polymer films on flexible substrates, due to the compatibility with the roll-to-roll technology. In case of single component polymer films, the inclusion of an electrical field enforces a proper organisation of molecules or whole crystallites, enabling a local change in the properties of the polymer film. Moreover, the method according to the present invention allows for modifying the self-organisation processes so as to predefined polymer pattern areas form already during the deposition of the polymer film. In turn, use of structurised electrodes and/or a variable field allows for "printing" of patterns, including e.g. tracks of semiconductor polymers. Unlike the methods of the state of art, the method for preparation of polymer films does not require any additional steps, as in the case of lithographic methods, nor the preparation of a polymer bilayer, improving the technological process and proves the economic advantages of the method.

Figure 1:
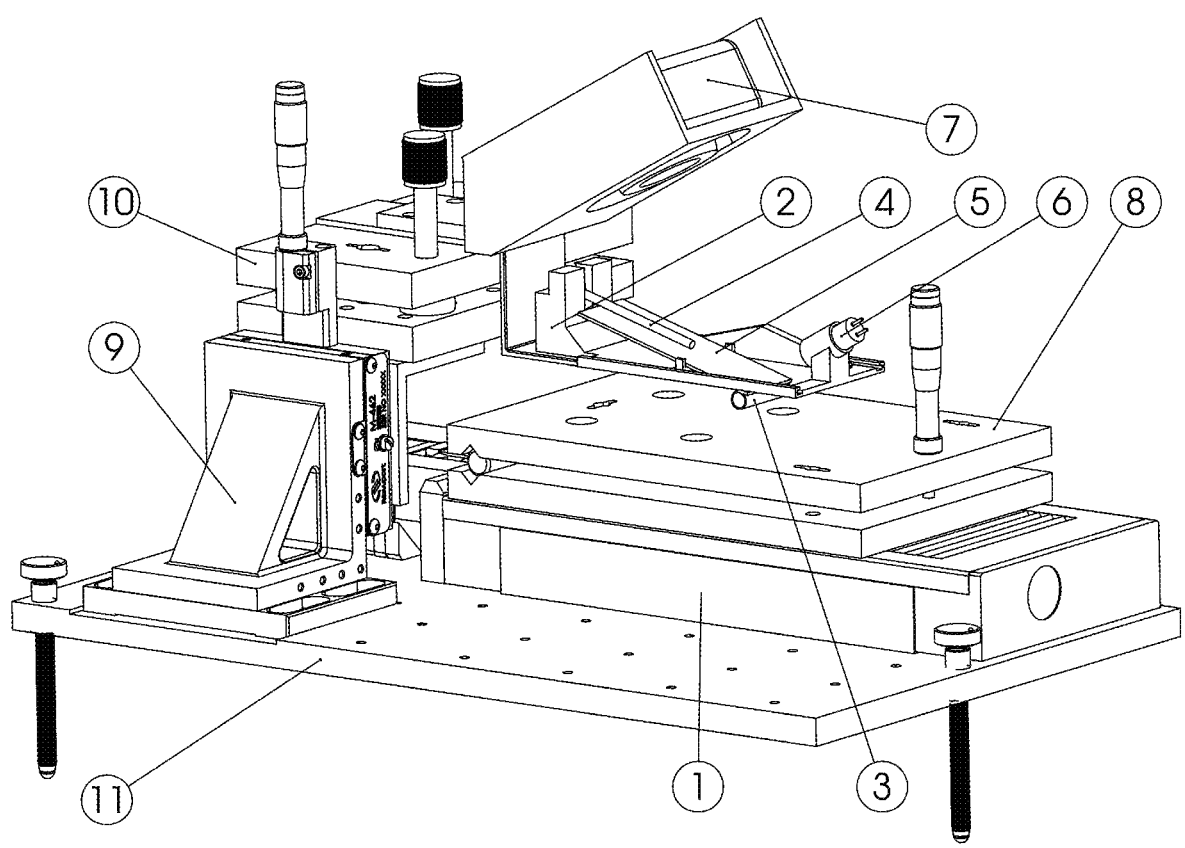
FIG. 1 is a front view of the device according to an embodiment of the present invention.
Figure 2:
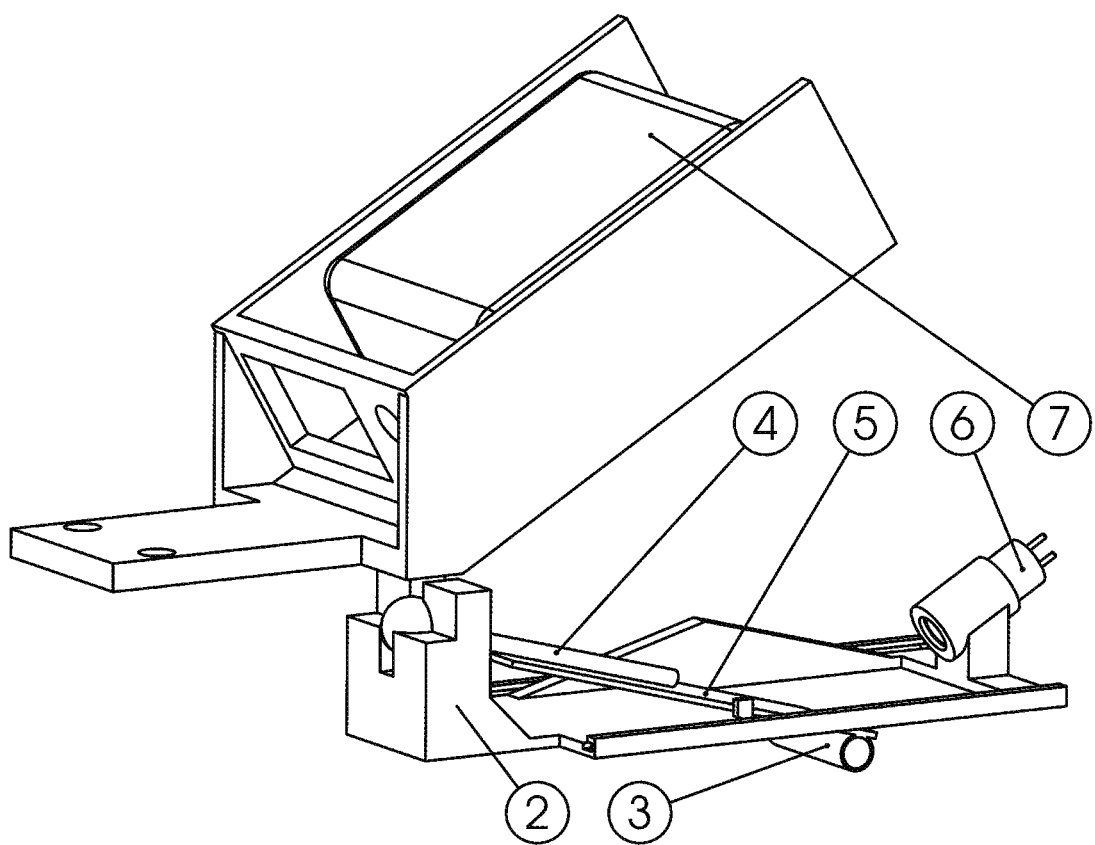
FIG. 2 is a schematic illustration of structural elements of the device of FIG. 1 according to an embodiment of the present invention.
Figure 4:
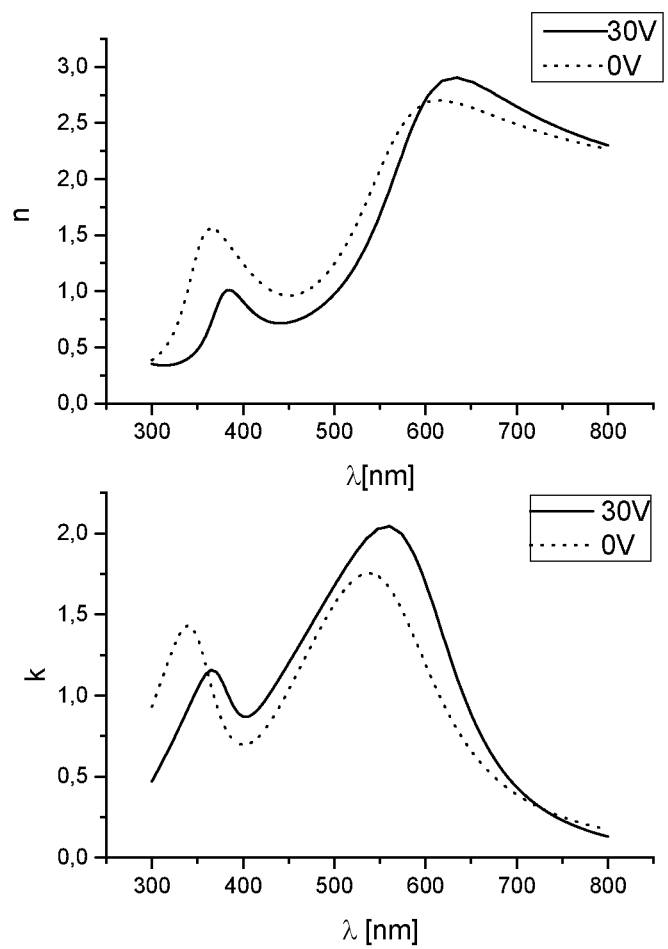
FIG. 4 shows the difference between the dependence of the refractive index n and the extinction coefficient k on the wavelength of light for an RP3HT film deposited without the electrical field and in the presence of the electrical field.

Exemplary embodiments of the invention are shown in the drawing, wherein FIG. 1 is a schematic illustration of the device for production of polymer films having a predefined spatial structure according to one embodiment of the present invention in an axonometric projection, FIG. 2 is a schematic illustration of structural elements of the device in FIG. 1, allowing for controlling the height of the cylinder over the sample's surface, as well as the tilt of the cylinder in relation to the sample's surface, FIG. 3 a), b), c) are a schematic representations of various positions of the cylinder in relation to the substrate, FIG. 3 d), e), f) are plots of the laser spot location vs. the height of the cylinder holder above the sample's surface, respectively, FIG. 3 g), h), i) are plots of the difference of the laser spot location vs. the height of the cylinder holder above the sample's surface, respectively, FIG. 4 shows the differences between the dependence of the refractive index n and the extinction coefficient k on the wavelength of light for an RP3HT film deposited without the electrical field and in the presence of the electrical field, FIG. 5 a)-e) show AFM images disclosing the impact of the electrical field on the phase separation in various polymer mixtures, FIG. 6 shows a) a photograph of the cylinder with electrodes applied and b), c) photographs of polymer films prepared using it for various configurations of voltages applied to the electrodes formed on the cylinder, FIG. 7 shows a) a fluorescence microscope photograph and b), c), d) AFM topographic images illustrating a difference in the structure of the polymer film formed by the method according to the present invention depending on the applied voltage, and e) a fluorescence microscope photograph illustrating a magnification of the boundary between various structures of the polymer film, and FIG. 8 shows a) a photograph of another polymer film formed by the method according to the present invention using a variable field and b) a fluorescence microscope photograph of this polymer film.

EXAMPLE 1—DESCRIPTION OF THE DEVICE FOR PRODUCTION OF POLYMER FILMS HAVING A PREDEFINED SPATIAL STRUCTURE

The device for production of polymer films having a predefined spatial structure, using electrical field for structural modification of the polymer films during their formation, as well as for formation of pattern areas with various structures, according to one embodiment of the present invention, is depicted schematically in FIG. 1. The main component of the device is a linear stage 1, which allows for moving a sample in relation to a stationary cylinder 3, lading to spreading of a polymer solution resulting in a film being formed. The linear stage 1 enables to select a proper speed, as well as acceleration. The second important component of subject device for production of polymer films having a predefined spatial structure is a holder 2 which allows for mounting the cylinder 3 spreading the layer. To obtain a uniform layer on the largest possible area, a proper positioning of the cylinder 3 spreading the solution layer in relation to the sample's surface is extremely important, as well as levelling of the whole system. To this end, several elements were provided which allow for a proper positioning of individual components of the device. A micrometric screw 9 allows for positioning the cylinder 3 at a proper height over the sample with an accuracy up to several μm. In turn, a first platform 8 allows for correcting the sample's inclination, so that the cylinder 3 moves at a constant height along sample's whole length. On the other hand, a second platform 10 allows for correcting of the cylinder's 3 tilt, so that it is parallel to the sample's surface. Additionally, the whole device is placed on a third platform 11 with three screws installed, which allow for levelling of the device for production of polymer films having a predefined spatial structure according to the present invention.

To control the height of the cylinder 3 above the sample's surface, as well as to correct its tilt, a system was used known from, among others, atomic force microscopy (AFM), for control of a distance between an AFM tip and a sample's surface. In a conventional system known from the art, a laser spot is reflected from a surface of a cantilever, on which the AFM tip is mounted, and the spot is tracked by a four-segment photodetector. When the AFM tip contacts with the surface, the cantilever is deflected, causing a change in the laser spot location on the photodetector. In the system used in the present invention for control of the height of the cylinder 3 (shown schematically in FIG. 2), a linear light beam generated by a laser 6 was used (and not a point one, as in known AFM systems), and additionally, the cylinder 3 spreading the solution is not connected with a flexible cantilever, but with a rigid glass 5. The whole height control system includes the holder 2, the cylinder 3, a bar with a small ball 4 at the end, the glass 5, the laser 6, a holder with a camera 7, and the whole system is mounted on the platform 10. The glass 5 with the cylinder 3 glued to it, is installed in the holder 2 using the bar with the small ball 4 at the end. Such a mounting allows for moving the cylinder 3 with the glass 5 not only in a vertical direction (in relation to the device), but also for tilting, which is important during positioning of the cylinder 3 in parallel to the sample's surface, so as to the cylinder is at the same distance above the sample's surface along the whole cylinder's length.

The principle of operation of the cylinder 3 height control system consists in detection of the linear light beam from the laser 6, reflected from the surface of the glass 5, on which the cylinder 3 is installed. The laser beam is tracked by the detector 7 having the form of the camera installed in the holder. If the cylinder 3 is positioned in parallel to the sample's surface, it touches the sample on its whole length when it contacts with the sample, and, as a result, when the holder 2 is brought even closer to the sample's surface, an upward movement (without tilting) of the cylinder 3 occurs, observed at the detector 7 as a displacement of the whole laser beam. In case where the cylinder 3 is not positioned in parallel to the surface, when it is brought closer, one of its ends (right or left) contacts with the sample at first, which leads to tilting of the cylinder 3 with the glass 5. As a result, the laser beam is rotated. While the holder 2 with the cylinder 3 is still being brought closer to the sample's surface, in one moment, the other end of the cylinder 3 contacts with the sample's surface (the cylinder 3 is leveled out in relation to the sample), and in consequence, the whole element rises, as in case of parallel positioning of the cylinder 3 in relation to the sample's surface. A proper algorithm implemented in the controller of the control system for the height of the cylinder 3 record the position of the whole reflected laser 6 beam, as well as positions of the beam reflected from the right and the left end of the glass 5 with the cylinder 3 installed. By tracking the changes in these three signals, it is possible to detect an improper positioning of the cylinder 3 in relation to the sample's surface, as well as setting a proper height of the cylinder 3 above the sample's surface. Example plots are shown in FIG. 3, presenting cases of a higher positioning of the left (a, d, g) or the right (c, f, i) end of the cylinder 3, as well as a parallel cylinder 3 positioning (b, e, h) in relation to the sample's surface.

By analysing the course of the location of the laser beam at the camera 7 vs. the distance, three main stages may be distinguished: I) the cylinder 3 is located above the sample's surface, II) one of the cylinder's 3 ends touches the sample, III) the other cylinder's 3 end touches the sample and the whole cylinder 3 rests on the sample's surface.

In the stage I, no changes in the location of the laser beam at the camera 7 while the cylinder is being brought closer to the sample's surface are observed. In the moment when one of the ends of the cylinder 3 starts touching the sample (stage II), the cylinder 3, together with the glass 5, start to rotate in the holder 2 (FIG. 3 *a*), c)). As a result, a change in the location of the laser beam at the camera 7 is observed (FIG. 3 *d*), f)). Moreover, because of the cylinder's 3 rotation, a difference in the locations of the laser beam reflected from the left and the right end of the glass 5 with the cylinder 3 installed is observed (FIG. 3 *g*), i)). When the other end of the cylinder 3 touches the sample (stage III), another change in the location of the laser beam at the camera 7 (FIG. 3 *d*), f)) may be observed, and in this moment, the whole cylinder 3 rests on the sample's surface. While continuing the lowering of the holder 2 with the cylinder 3, it starts to rise, and the difference in the locations of the laser beam reflected from the left and the right end of the glass 5 with the cylinder installed 3 is constant (FIG. 3 *g*), i)). In case when the cylinder 3 is tilted in relation to the sample's surface, two "bends" in the signal representing the location of the laser beam at the camera 7 recorded vs. the height may be observed, and also, a distinct jump in the difference is visible between the locations of the laser beam reflected from the left and from the right end of the glass 5 with the cylinder installed 3. When the cylinder 3 is parallel to the substrate, both its end touch the sample's surface simultaneously (the cylinder 3 touches the sample with whole its length) not causing any tilt. It is observed as one "bend" of the signal representing the location of the laser beam at the camera 7 recorded vs. the height (FIG. 3 *e*)), and the difference between the locations of the laser beam reflected from the left and from the right end of the glass 5 with the cylinder installed 3 does not exhibit any distinct jump (FIG. 3 *h*)). The presented cylinder height control system 3 allows for determining the cylinder's height above the sample's surface with an accuracy of up to several micrometers. Also, the system is sensitive enough to allow for determining the angle between the sample's plane and the cylinder 3 (no parallelism between the surfaces) with an accuracy of up to 0.1°.

In the device for production of patterned polymer layers, the cylinder 3 spreading the polymer solution is made of glass. However, it is not limiting, and a person skilled in the art will be able routinely to use other types of materials for the cylinder 3, without departing of the essence of the present invention. The cylinder 3 has a layer of gold applied on its surface, acting as an electrode. Also in this case, the methods of application of the metallic layer, as well as the electrode material are not limiting for the present invention. It is possible to form electrodes with various predefined shapes using lithographic techniques or masks on the surface of the cylinder 3. In the device for production of patterns in the polymer films, a voltage difference is applied between the conducting sample and the electrodes formed on the cylinder 3, resulting in an electrical field oriented perpendicularly to the substrate. In an alternative embodiment of the device for production of patterns in the polymer films on the cylinder 3, a higher number of mutually separated electrodes (e.g. two, three) may be formed, and the voltage difference may be applied also between the electrodes formed on the cylinder 3.

A conductive substrate (e.g. glass with an applied ITO layer) is introduced to the device for production of polymer films having a predefined spatial structure described above, placed on the platform 8 mounted on the linear stage 1. The platform 11 supported by three levelling legs, enables to level the whole device. Additional levelling is provided by the platform 8 equipped with an inclination adjustment system in for least one inclination plane, preferably for three planes. Similarly, the platform 10 of the cylinder 3 is equipped with an inclination adjustment system for at least two inclination planes (preferably for three planes), to which the holder is fixed rigidly for the glass 5 with the bar 4 and the cylinder 3 having metallic electrodes evaporated thereon. After the system is leveled, a mixture of polymers is introduced between the substrate and the cylinder 3, and then, the polymer solution is spread, ensuring a linear movement due to the linear stage 1. In order to modify the polymer film, i.e. form a desired pattern in the film, during solution spreading, the controlled electric voltage originating from the controllable voltage source is applied between the metallic electrode on the cylinder 3 and the conductive substrate. Switching on/off the electric voltage and use of proper voltage courses causes a local modification of the structure of the polymer film and formation of a desired pattern in it. The thickness and uniformity of the polymer film being prepared is changed by providing a proper distance and tilt of the cylinder 3 in relation to the substrate and by controlling the speed and acceleration of the linear movement of the substrate.

EXAMPLE 2—EXEMPLARY EMBODIMENTS PRESENTED FOR FORMATION OF A UNIFORM POLYMER FILM

In order to confirm the possibility to use the subject method for preparation of polymer films having a predefined spatial structure for imparting desired electro-optical properties to single component polymer films, experiments showing the impact of the electrical field applied between the cylinder 3 and the substrate during spreading on electro-optical properties of mentioned polymer films were carried out. In the experiment, a conjugated polymer RP3HT (regioregular poly(3-hexylthiophene-2,5-diyl)) was used, having an average molecular mass $M_n$ in the range of from 54000 to 75000, as characterised by the manufacturer, dissolved in chlorobenzene in a concentration of 15 mg/ml. During spreading of the solution, voltages of 0 V and 30 V were applied to the electrodes. These areas were examined by spectral ellipsometry providing information on refractive index n and extinction coefficient k. The plots presented in FIG. 4 show that the maxima of both the refractive index n, and the extinction coefficient k, shift towards longer wavelengths. It indicates a change in the structure of electron levels in areas formed in the presence of the electrical field. Thus, by applying a variable electrical field during the spreading of polymer solution, single component polymer films with patterns characterised by changed electro-optical properties may be obtained.

EXAMPLE 3—PREPARATION OF COMPOSITE FILMS HAVING A PREDEFINED SPATIAL STRUCTURE USING AN ELECTRICAL FIELD APPLIED DURING THEIR DEPOSITION

In order to demonstrate a possibility to prepare polymer films having a predefined spatial structure using electrical field applied during the deposition of the films, three polymer mixtures having technological use were selected. These polymers are two semiconductors from the polythiophene family, used in organic electronics and photovoltaics, distinguishing themselves by a high charge mobility and commercial availability: regioregular poly((3-hexylthiophene-2, 5-diyl) RP3HT and poly(3,3'''-didodecyl-2,2';5',2'';5'',2'''-quaterthiophene) PQT12. In the experiments carried out, they form pairs with insulating polymers, such as poly(methyl methacrylate) PMMA or poly(ethylene glycol)-block-poly(s-caprolactone) PEG-PCL, used previously in organic field effect transistors (PMMA) or as a biocompatible polymeric material (PEG-PCL). The tested polymer mixtures are RP3HT and PEG-PCL system (FIG. 5 a)-c)), RP3HT and PMMA system (FIG. 5 d)), and PQT12 and PEG-PCL system (FIG. 5 e)). The application of similar mixtures having a strictly defined structure of phase domains in electrospinning of nanofibers was demonstrated previously—for the RP3HT/PCL pair (S. Lee et al., "Continuous production of uniform poly(3-hexylthiophene) (P3HT) nanofibers by electrospinning and their electrical properties", J. Mater. Chem., 2009, 19, 743), or FET transistors manufacturing on silicon substrates or flexible films—for the RP3HT/PMMA (X. Wang et at, "Self-stratified semiconductor/dielectric polymer blends: vertical phase separation for facile fabrication of organic transistors", J. Mater. Chem. C, 2013, 1, 3989) and PQT12/PMMA pairs (A. Salleo & A. C. Arias, 2007).

The solutions of polymer mixtures with a concentration of 15 mg/ml were prepared in chlorobenzene. Average molecular masses of the polymers used reported by their manufacturers amount to: RP3HT—$M_n$ in the range of from 15000 to 45000 (Aldrich Chemical Co.), PMMA—$M_n$=61800 (PSS Polymer Standards Service GmbH), PEG-PCL $M_n$~18000 (PCL ~13000, PEG ~5000) (Aldrich Chemical Co.). The films prepared from the RP3HT and PEG-PCL polymer mixture were deposited with a solution spreading velocity of 2 mm/s, and the RP3HT and PMMA, and PQT12 and PEG-PCL mixtures—with a velocity of 1 mm/s.

The atomic forces microscopy (AFM) images presented in FIG. 5 reflect the phase structure of the mixtures with various weigh fractions of mixture components (w:w, reported in brackets), deposited without an electrical field (0 V) and with the electrical field (30 V). For the pair RP3HT+PEG-PCL (FIG. 5a)-5c)), all images, except for FIG. 5 a) for 0 V, reflect a lateral domain structure, in which—with the increase in mass content of RP3HT in the mixture (presented as from 50 to 60% by wt.)—the area occupied by higher domains, rich in RP3HT, increases, and the lower domain area, rich in the insulator PEG-PCL, decreases. This interpretation of two domain types (higher and lower) was confirmed by additional SIMS studies. AFM images show also that in case of mixtures having the mass composition of 50:50 (RP3HT:PEG-PCL), the films deposited without an applied field (FIG. 5 a) for 0 V) exhibit a lamellar structure. Additional studies by SIMS confirmed the lamellar structure, with a semi-conductor (RP3HT) lamella adhering to the substrate, covered with a phase rich in the insulator (PEG-PCL). Composite films with a similar structure were used in FET transistors for formation of lamellae of the active semiconductor, being covered—in the same deposition process—with a passivation lamella protecting the organic transistor from the influence of the environment (A. Salleo and A. C. Arias, 2007). Self-stratified lamellae form during the evaporation of the solvent from the deposited composite film as a result of the process of separation of polymer phases directed by the film surfaces. It is known from the literature of the subject that even a slight change in physico-chemical properties of the substrate causes to a modification of its interaction with the mixture, leading to a different course of the phase separation and film's formation processes, enabling a substrate-controlled change from the lamellar structure to lateral domain structure (A. Budkowski et al., 2012). Inclusion of an electrical field in the conducting polymer solution modifies its deposition on the substrate and changes physico-chemical properties of the substrate (S. Wang et al., "Electric-field induced layer-by-layer assembly technique with single component for construction of conjugated polymer films", RSC Adv., 2015, 5, 58499). Analogous physico-chemical changes of external surfaces of a layer, introduced in the device according to the present invention, by the electrical field in the beginning of the film formation process, i.e. only in the area under the solution-spreading cylinder 3 with electrodes, modify both the remainder of the layer formation process, and the final structure of the polymer mixture film (compare the images for 0 V and 30 V in FIG. 5 a)). Thus, by using an electrical field, the structure may be modified from a lamellar one to a lateral-domain one, as well as by the substrate.

When the composition of the polymer mixture is selected properly, a breakup of the lamellar structure leads to a fragmentation of the semiconductor into individual domains insulated in a continuous insulator phase—resulting in electrical isolation (A. Salleo and A. C. Arias, 2007). The spatial control of the lamellar and lateral separation processes achieved by using the substrate patterns, enables to obtain polymer composite films from the solution in one step, the films serving the purpose of matrices for several dozen well-isolated transistors with a zero crosstalk (A. Salleo and A. C. Arias, 2007). The results illustrated with the images of FIG. 5 a) show that a similar spatial control of the structure of composite films may be achieved by using an electrical field, switch on and off during the deposition of the films. Literature reports indicate that the change from a lamellar structure to a lateral domain structure may be obtained also by a change in the mass composition of the polymer mixture (L. Qiu et al., "Versatile Use of Vertical-Phase-Separation-Induced Bilayer Structures in Organic Thin-Film Transistors", Adv. Mater. 2008, 20, 1141). Also in the studied case (FIGS. 5 a) and 5 b)), a change in the RP3HT:PEG-PCL composition from 50:50 to 55:45, at a zero field, leads to a destruction of the lamellar structure in favour of the lateral domain structure, similarly as switching the electrical field on in case. of the 50:50 mixture. Furthermore, a similar influence on the layer morphology—by a change in the composition (from 55:45 to 60:40) at a zero field or by switching the electrical field on (for the 55:45 mixture)—may be observed for films with a lateral domain structure (FIGS. 5 b) and 5 c)). Herein, the electrical field causes (FIG. 5 b)) an exchange of the matrix continuous phase (a semiconductor instead of a dielectric) and the isolated domains phase (a dielectric instead of a semiconductor), leading to—apart from morphological changes—also changes in other properties of the film, such as, e.g., lateral electrical conductivity. For RP3HT:PEG-PCL mixtures with a more asymmetric composition (60:40) and a lateral structure of isolated domains in a continuous matrix, an application of an electrical field leads to a reduction of characteristic domain sizes. In turn, a change in domain sizes may lead to a modification of e.g. optical or thermal properties of the films of polymer mixtures.

The above observations made for an RP3HT and PEG-PCL mixture find a confirmation in the results obtained for other polymer pairs. Thus, the influence of the electrical field on the formation of developed lateral domain structures at the cost of lamellar structures put forward above, may be found also for a 50:50 RP3HT:PMMA mixture (FIG. 5 d)). In turn, the influence of the electrical field on the reduction of sizes of lateral isolated domains in a continuous matrix was found also for the 50:50 PQT12:PEG-PCL mixture (FIG. 5 e)).

EXAMPLE 4—FORMATION OF PATTERNS OF AREAS IN POLYMER FILMS (VARIOUS ELECTRODE SHAPES)

In one of the embodiments of the present invention, utilising the device for production of polymer films having a predefined spatial structure described in the first embodiment, the possibility to form predefined patterns of polymer areas with various structures using electrodes of various shapes vapour-deposited onto the cylinder 3 was proved. To this end, three gold electrodes were vapour-deposited onto the glass cylinder 3, separated with intervals having approx. 1 mm, using a pre-prepared mask. The shape of the vapour-deposited electrodes is shown in FIG. 6 a), presenting a photograph of the cylinder 3 with visible three electrode areas. Then, a voltage of 20 V was connected to external electrodes, and a voltage of −20 V was connected to the central electrode. Using cylinder with such electrodes, the film of a RP3HT and PEG-PCL mixture (50:50) dissolved in chlorobenzene (Cp=15 mg/ml) was formed by solution spreading (v=2 mm/s), with the electric voltage switched on twice during the film formation and resulting in patterns of areas in the final polymer film. The photographs of the sample shown in FIG. 6 b) reveal three sectors: two sectors with visible different areas, in which an electrical field was applied between the grounded sample and the cylinder 3, and one sector, in which the electrical field was not present. In the areas with the voltage difference applied, continuous lines occurring in the intervals on the electrode are clearly visible. Fluorescent microscopy images (FIG. 7 a) and e)), as well as AFM images (FIG. 7 b)-d)) clearly show a different structure of areas of the polymer film. The obtained images of FIG. 7 reveal a domain structure in the area, in which an electrical field was present during the solution spreading and film formation (such as was the case for uniform electrodes) and suggest a lamellar structure in the area of the electrode intervals, the same as for the area, in which the solution spreading and film formation occurred without the electrical field.

Then, the polymer film was formed without application of a voltage to the external electrodes, i.e. using a cylinder 3 having an electrode structure shown in FIG. 6 a), the polymer film was formed applying a voltage of −20 V only to the central electrode. During the formation of the polymer film, the electrical field was switched on two times. Photograph of the sample (FIG. 6 a), the right panel) clearly shows a modification of the polymer layer in the area, in which the electrode with a field applied (−20 V) has been present.

EXAMPLE 5—FORMATION OF PATTERNS IN THE POLYMER FILMS (FIELDS VARIABLE IN TIME)

In one of the embodiments of the present invention, utilising the device for production of polymer films having a predefined spatial structure described in the first embodiment, the possibility to form predefined polymer patterns using electrodes of various shapes vapour-deposited onto the cylinder 3 with application of a time-variable field was proved. To this end, a gold electrode was vapour-deposited onto the glass cylinder 3, having a width of approx. 1.5 mm, using a mask. Then an alternating square-wave electric field (amplitude in the range of from 0 V to 20 V) with a frequency of 1 Hz was applied between the electrode and a conductive sample, and then, a film of the RP3HT and PEG-PCL mixture (50:50) dissolved in chlorobenzene (Cp=15 mg/ml) was spread. A photograph of the so-prepared polymer film (FIG. 8 a)) shows various area formed under the influence of the variable electrical field. A fluorescent microscopy photograph (FIG. 8 b)) confirms formation of alternating areas with a visible domain structure and with a lamellar structure, induced by the variable electrical field.

The experiments carried out above reveal a possibility to apply the method for formation of polymer films having a predefined spatial structure according to the present invention to obtain predefined polymer patterns by selecting proper polymers, a solvent, as well as electrodes with proper shapes or a variable electrical field. This effect is repeatable, and it is possible to create patterns on a large surface.

The invention claimed is:

1. A device for producing polymer films having a predefined spatial structure, the device comprising:
   a linear stage,
   a platform for a substrate,
   a cylinder for spreading a polymer solution layer over the substrate to deposit a polymer film onto the substrate,
   a cylinder height adjustment system,
   a control system for adjusting a height and tilt of the cylinder in relation to the substrate,
   a controllable voltage source,
   at least one metallic electrode fixed onto the cylinder,
   wherein the substrate onto which the polymer film is deposited is conductive for electric current,
   and wherein electric voltage from the controllable voltage source is applied between the at least one metallic electrode and the substrate during deposition of the polymer film onto the substrate.

2. The device according to claim 1, wherein the platform for the substrate is placed on the linear stage and ensures a linear movement of the substrate in relation to the cylinder that is stationary.

3. The device according to claim 1, wherein the cylinder height adjustment system is a micrometer screw.

4. The device according to claim 1, wherein the control system comprises a laser, a detector, and the cylinder fixed to a glass, the elements being arranged so that the laser emits a linear light beam directed onto the glass connected to the cylinder, and the beam reflected from the glass hits the detector.

5. The device according to claim 1, wherein the platform for the substrate has an inclination adjustment system for at least one inclination plane.

6. The device according to claim 1, wherein the cylinder is fixed to a cylinder platform having an inclination adjustment system for at least two inclination planes.

7. The device according to claim 1, wherein the device is placed on a device platform carried by three levelling legs.

8. The device according to claim 1, wherein the cylinder is made of an insulator.

9. The device according to claim 1, wherein at least one electrode corresponding to a desired pattern being formed in the polymer film is mounted on the cylinder.

10. The device according to claim 1, wherein the controllable voltage source generates one of: a constant voltage signal, a time-alternating voltage signal, a square-wave voltage signal, a sinusoidal voltage signal, a triangle-wave voltage signal.

* * * * *